United States Patent [19]

Hyde et al.

[11] Patent Number: 4,480,239
[45] Date of Patent: Oct. 30, 1984

[54] LOOP-GAP RESONATOR NETWORK

[75] Inventors: James S. Hyde, Dousman, Wis.; Wojciech Froncisz, Krakow, Poland

[73] Assignee: The Medical College of Wisconsin Inc., Milwaukee, Wis.

[21] Appl. No.: 464,473

[22] Filed: Feb. 7, 1983

[51] Int. Cl.³ .......................... H01P 7/06; G01R 33/08
[52] U.S. Cl. ..................................... 333/219; 324/315; 333/175; 333/185
[58] Field of Search ............... 333/219, 222, 227, 235, 333/175, 176, 185, 202, 212; 324/315, 316, 318, 322

[56] References Cited
U.S. PATENT DOCUMENTS
2,996,610 8/1961 Relis .............................. 333/235 X

OTHER PUBLICATIONS

W. N. Hardy and L. A. Whitehead, "Split-Ring Resonator for use in Magnetic Resonance from 200-2000 MHz", 1981 American Institute of Physics, Rev. Sci. Instrum. 52 (2), Feb. 1981; pp. 213-216.

Primary Examiner—Marvin L. Nussbaum
Attorney, Agent, or Firm—Barry E. Sammons

[57] ABSTRACT

A lumped circuit loop-gap resonator is formed by a plurality of openings formed through a block of material. The openings form inductive loop elements and these are interconnected in a variety of possible networks by capacitive gap elements. String, star, ring and lattice networks are described.

10 Claims, 11 Drawing Figures

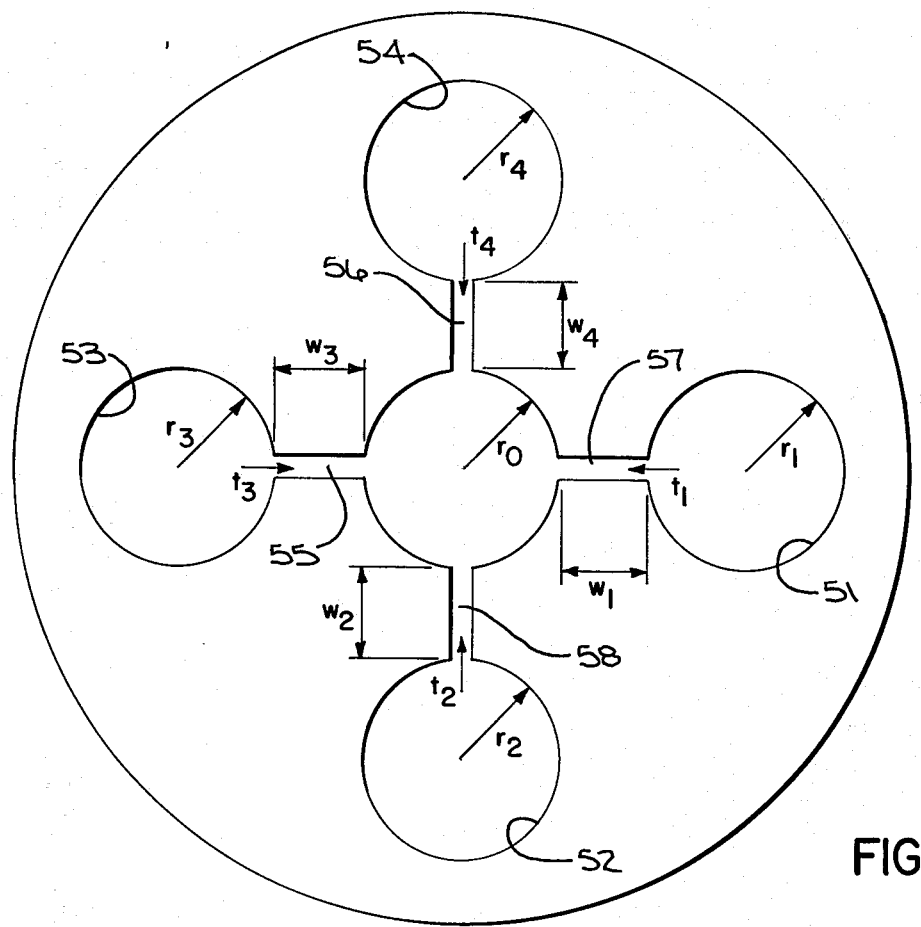
FIG.3E
FIG.3F
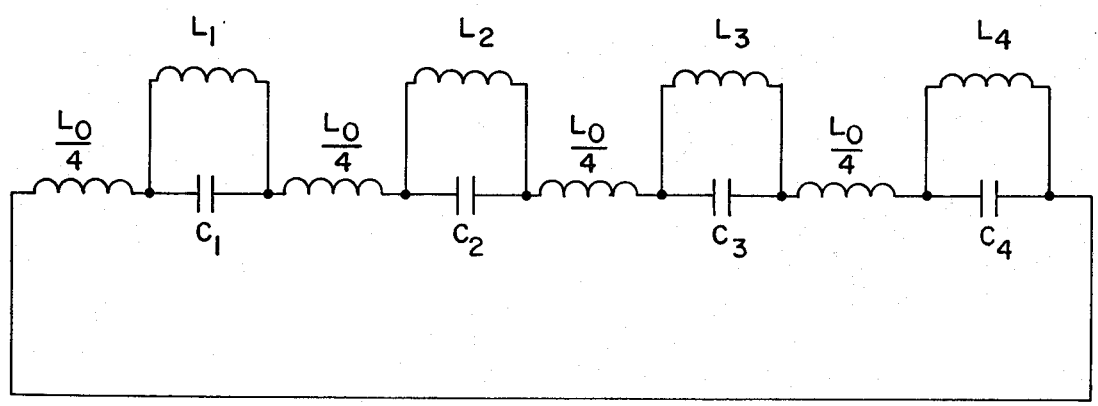

LOOP-GAP RESONATOR NETWORK

BACKGROUND OF THE INVENTION

The field of the invention is radio frequency resonators, and particularly, resonators employed in gyromagnetic resonance spectroscopy.

Gyromagnetic resonance spectroscopy is conducted to study nuclei that have a magnetic moment, which is called nuclear magnetic resonance (NMR) and electrons which are in a paramagnetic state which is called paramagnetic resonance (EPR) or electron spin resonance (ESR). There are also a number of other forms of gyromagnetic spectroscopy that are practiced less frequently, but are also included in the field of this invention. In gyromagnetic resonance spectroscopy a sample to be investigated is subjected to a polarizing magnetic field and one or more radio frequency magnetic fields. The frequency, strength, direction, and modulation of the magnetic fields varies considerably depending upon the phenomena being studied. Apparatus such as that disclosed in U.S. Pat. Nos. 3,358,222 and 3,559,043 has been employed for performing such experiments in laboratories, but widespread commercial use of gyromagnetic resonance spectroscopy techniques has been limited.

The reason for the limited commercial application of gyromagnetic resonance spectrometers is their complexity and high cost. Very high radio frequencies are required for some measurement techniques (such as electron spin resonance measurements) and very strong polarizing magnetic fields are required for others (such as nuclear magnetic resonance). In addition, the physical structures for applying multiple fields to a specimen are complex particularly when the temperature of the specimen is to be controlled, or the specimen is to be irradiated with light during the measurement.

A loop-gap resonator which offers many advantages over prior structures used in gyromagnetic resonance spectrometers is disclosed in our co-pending U.S. patent application Ser. No. 310,231 which was filed on Oct. 9, 1981, now U.S. Pat. No. 4,446,429, and which is entitled "Microwave Resonator". The size of this loop-gap resonator, the number and size of the gaps which it contains and the materials from which it is constructed are variables which enable the resonator to be used in a wide variety of measurements and over a wide range of frequencies.

This loop-gap resonator employs a shield which not only confines the electric and magnetic fields to the resonator but which also increases the quality factor, or Q, of the resonator. The resulting structure is generally cylindrical and is convenient for many gyromagnetic resonance measurements. On the other hand, the shield is a separate element which adds complexity and cost to the resonator structure. To provide adequate thermal and mechanical stability the separate elements must be mounted firmly together using structures such as those disclosed in our co-pending U.S. patent application Ser. No. 361,594 which was filed on Mar. 25, 1982, now U.S. Pat. No. 4,453,147, and which is entitled "Modular Lumped Circuit Resonator". The difficulty of providing mechanical stability increases as the number of gaps in the resonator are increased and at microwave frequencies the dimensions of the separate parts are less than one millimeter making machining and assembly of these prior structures difficult.

SUMMARY OF THE INVENTION

The present invention relates to a lumped circuit loop-gap resonator which is formed from a block of material and which includes a plurality of resonator loops formed by openings through the material and a resonator gap formed by a slot through the material which intersects the loops along their entire length. By selecting the number, size and shape of the loop and gap elements, and by selecting their interconnection pattern, a variety of magnetic fields can be generated for gyromagnetic spectroscopy.

A general object of the invention is to reduce the number of mechanical elements in the resonator structure. The loops and gaps can be formed in a single block of material. The material may be electrically conductive, or it may be a nonconductive material which is coated with a conductive layer as disclosed in our co-pending U.S. patent application Ser. No. 361,595, filed on Mar. 25, 1982, now U.S. Pat. No. 4,435,680, and which is entitled "Microwave Resonator Structure".

Another object of the invention is to eliminate the need for a separate shield. Although a shield may be added at each end of the resonator to improve the quality factor, or "Q", of the resonator, none is required to limit radiation of the electromagnetic field. Instead, the electric field is concentrated in the gaps, which in turn are each bordered on their two lengthwise edges by resonator loops. Also, the magnetic flux which eminates from the end of one resonator loop flows into the ends of adjacent resonator loops and is thus closely confined near the ends of the resonator.

Another object of the invention is to provide a multigap resonator which is easy to manufacture. The resonator loops may be arranged in a number of patterns, or networks with interconnecting resonator gaps. In a star network for example, a central resonator loop is connected to surrounding satellite resonator loops by a plurality of resonator gaps. The magnetic field in the central resonator loop is highly homogeneous, and by reducing its cross sectional area relative to the satellite resonator loops, the magnetic field energy is concentrated in the central resonator loop giving a good filling factor. The filling factor is the ratio of total magnetic energy in the space occupied by the specimen divided by the total magnetic energy in the resonator.

The foregoing and other objects and advantages of the invention will appear from the following description. In the description, reference is made to the accompanying drawings which form a part hereof, and in which there is shown by way of illustration a preferred embodiment of the invention. Such embodiment does not necessarily represent the full scope of the invention, however, and reference is made therefore to the claims herein for interpreting the scope of the invention.

BRIEF DESCRIPTION OF THE DRAWINGS

FIGS. 3B–3F are schematic representations of the resonator of FIG. 3A;

DESCRIPTION OF THE PREFERRED EMBODIMENT

Figure 1:
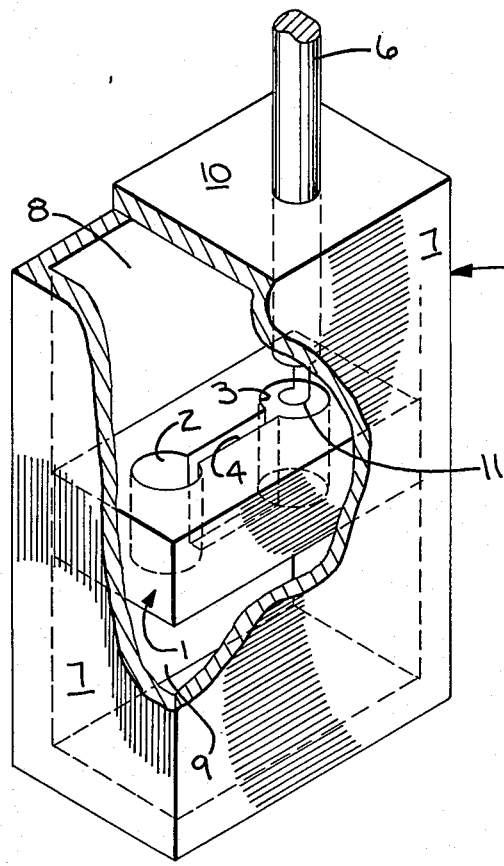
FIG. 1 is a perspective view with parts cut away of a preferred embodiment of the resonator assembly.

Referring particularly to FIG. 1, a resonator is formed by a rectangular block of material 1 in which two resonator loops are formed by circular openings 2 and 3 that extend completely through the block 1. A resonator gap is formed by a slot 4 which connects the two loops 2 and 3 and which extends completely through the block 1. The block 1 may be formed from an electrically conductive material such as copper or brass that has been silver plated, but a non-conductive base material having a low coefficient of thermal expansion and high machinability is preferred. Several machineable glasses and ceramics are suitable, but a ceramic material available from Corning Glass under the trademark "Macor" has been used with great success. In any case, the surfaces of the selected base material are coated with a conductive layer as described in the above-cited co-pending U.S. patent application Ser. No. 361,595, which is incorporated herein by reference.

The loops 2 and 3 and the gap 4 form a lumped circuit resonator network which resonates at radio frequencies determined by its geometry. In contrast to distributed circuit cavity resonators, the lumped circuit resonator network of the present invention has dimensions which are much less than the wavelength of the radio frequency signal at which it resonates. An additional characteristic of this lumped circuit resonator network is that the capacitive and inductive elements are identifiable and the electromagnetic energy oscillates between a magnetic field supported by the inductive element and an electric field supported by the capacitive element.

These characteristics provide a number of advantages over cavity resonators. The inductive element is the loops 2 and 3 and the capacitive element is the gap 4. The magnitude of the magnetic field is nearly uniform and of maximum amplitude in the cylindrical volumes defined by the loops 2 and 3, and the electric field is maximum in the gap 4. This is very desirable in gyromagnetic resonance spectroscopy since a test sample placed inside one of the loops 2 or 3 is subjected to maximum uniform magnetic field intensity and minimum electric field intensity.

The cross sectional area of the loops 2 and 3 need not be the same and they need not be circular in shape. The magnetic field intensity is greatest in the smaller loop and thus the "filling factor" can be changed by altering the relative sizes of the loops. The filling factor affects the sensitivity of the spectrometer. Because the magnetic field is more homogeneous with circular shaped loops, this shape is preferred in most gyromagnetic resonance studies.

Referring still to FIG. 1, the resonator forms part of an assembly which includes a shield 5 and a coaxial cable 6. The shield 5 may be formed from an electrically conductive material, or it may be formed from a non-conductive material, such as glass epoxy, with its inside surface coated with a layer of silver. The shield 5 includes four side walls 7 which abut the sides of the rectangular resonator block 1 to hold it firmly in place. The walls 7 extend beyond each end of the resonator block 1 to form spaces 8 and 9. The coaxial cable 6 is supported by an end wall 10 of the shield 5 and a coupling loop 11 formed at the end of the cable 6 is positioned along the central axis of the resonator loop 3. Radio frequency energy is supplied to the resonator assembly from the coaxial cable 6 by the coupling of their magnetic fields.

The shape of the shield 5 and the manner in which radio frequency energy is applied to the resonator assembly may vary substantially from the structure shown in FIG. 1. For example, if the resonator block is circular cylindrical in shape as shown in FIGS. 2 and 3, the surrounding shield may assume a circular cylindrical shape. As will become apparent from the description below, the extent to which the shield extends beyond the ends of the resonator blocks has a relatively minor effect on the resonant frequency, but a rather substantial effect on the quality factor, or "Q", of the resonator. Radio frequency energy may be applied to the resonator assembly by coupling to the electric field in the gap 4. In such case, the coaxial cable 6 terminates with a dipole formed by a straight section of its center conductor positioned immediately above the gap 4. Also, energy may be supplied to the resonator from a waveguide which connects to the shield 5. These and other variations are possible with the different resonator networks now to be described.

Figure 2A:
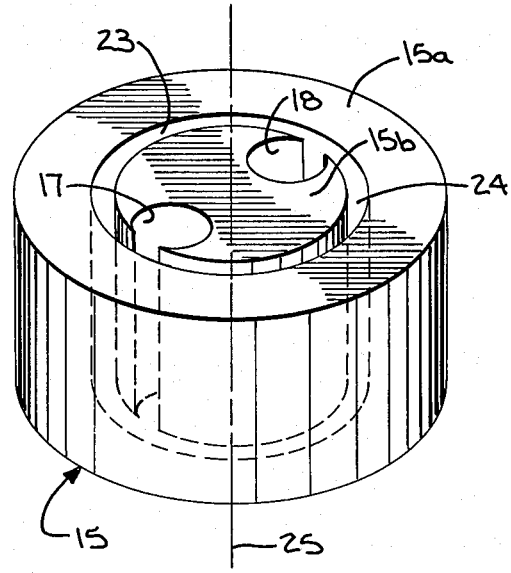
FIGS. 2A and 2B are perspective views of alternative embodiments of the resonator in which the loops and gaps are interconnected in a ring network.
Figure 2B:
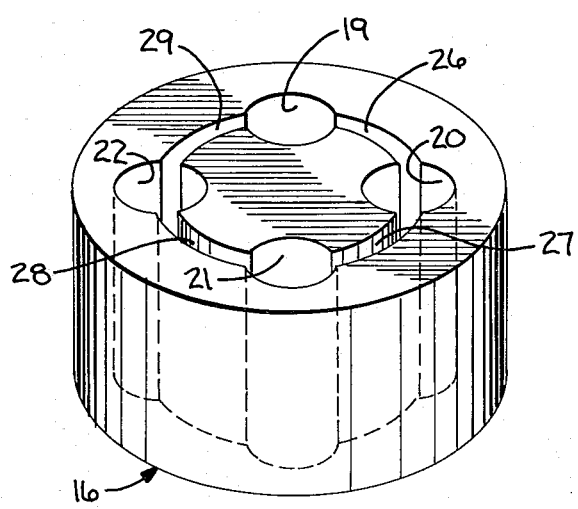

Referring particularly to FIGS. 2A and 2B, the resonator block may be circular cylindrical in shape as indicated at 15 and 16. In the embodiment shown in FIG. 2A there are two resonator loops 17 and 18 formed in the resonator block 15 whereas the embodiment of FIG. 2B contains four resonator loops 19-22. The resonator loops 17 and 18 are interconnected by two resonator gaps 23 and 24, which together form a circle that divides the resonator block 15 into two separate parts 15a and 15b. The resonator gaps 23 and 24 intersect each resonator loop 17 and 18 tangentially at a single location to form a structure which is easily machined on a lathe as two separate elements. Also, by translating the section 15b along a central axis 25 in either direction, the resonant frequency of the structure in FIG. 2A can be adjusted.

The resonators of FIGS. 2A and 2B have an equal number of loop and gap elements which are interconnected in a closed, or ring, network. The four resonator loops 19-22 in the structure of FIG. 2B are interconnected by four resonator gaps 26-29 which form a circle that intersects the resonator loops 19-22. Two separate slots are thus formed in each resonator loop 19-22 by the interconnections. While the circular shapes and the symmetry of this structure is not necessary for proper operation, it does facilitate economical and accurate construction of the resonator network.

Figure 4:
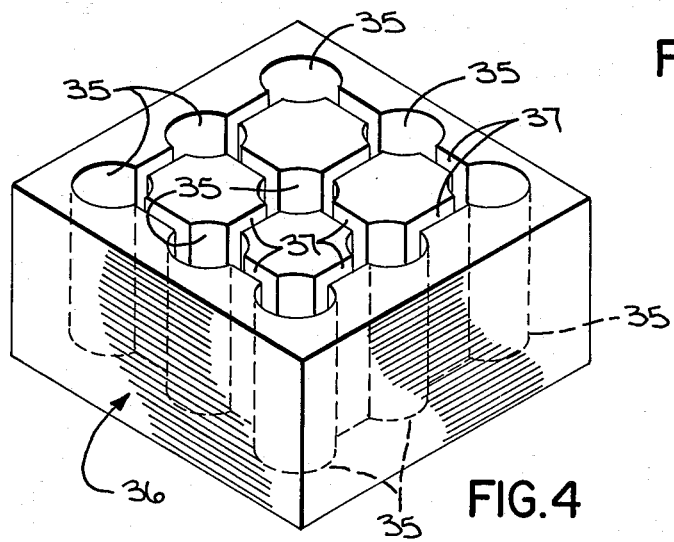
FIG. 4 is a perspective view of another embodiment of the resonator in which the loops and gaps are interconnected in a lattice network.
Figure 5:
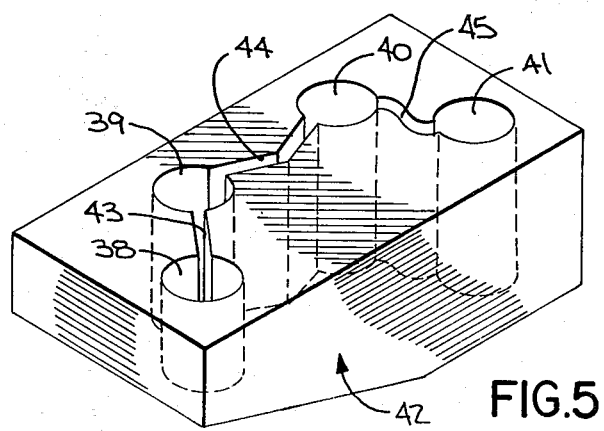
FIG. 5 is a perspective view of yet another embodiment of the resonator in which the loops and gaps are interconnected in a string network.

Referring particularly to FIGS. 4 and 5, the network formed by the interconnection of the resonator loops and resonator gaps may take a variety of forms. In FIG. 4, nine resonator loops 35 are formed through a rectangular resonator block 36. Twelve resonator gaps 37 interconnect these resonator loops 35 to form a "lattice" network. On the other hand, the resonator of FIG. 5 includes four resonator loops 38-41 formed in a substantially rectangular resonator block 42. The resonator loops 38-41 are interconnected by three resonator gaps 43 to form a "string" network. This embodiment of the invention also demonstrates that the resonator gaps need not be straight lines or continuous curves, but may instead contain discontinuities as with the resonator gap 44 or define complex curves as with the resonator gap 45. In addition, the thickness of the resonator block 42 need not be uniform with the result that the resonator loops 38-41 in the network have different lengths.

Figure 3A:
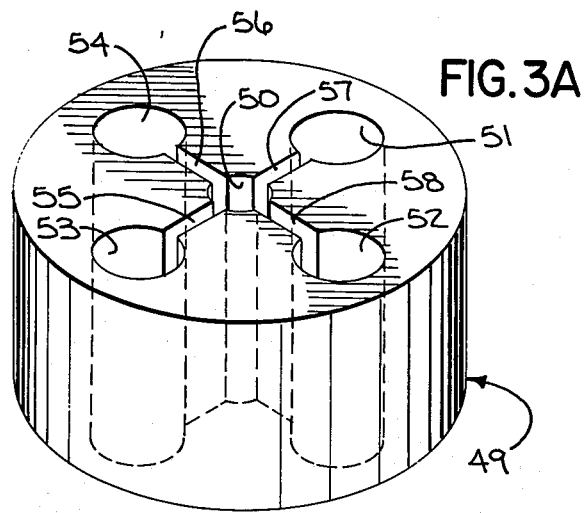
FIG. 3A is a perspective view of an alternative embodiment of the resonator in which the loops and gaps are interconnected in a star network.

Referring particularly to FIG. 3A, the resonator network may take yet another form 49 in which a central resonator loop 50 is interconnected to a series of satellite resonator loops 51-54 by outward extending resonator gaps 55-58. The central resonator loop 50 in this "star" network contains four intersecting gaps 55-58, and as explained in our prior U.S. patent application Ser. No. 310,231, the homogeneity of the resulting magnetic field in such a loop-gap resonator is much improved over the single gap embodiments. Such homogeneity is of significance in some gyromagnetic resonance measurements.

The star network configuration of FIG. 3A is shown schematically in FIG. 3E, and the equivalent electrical circuit is shown in FIG. 3F. To simplify calculations, we assume that the satellite resonator loops 51-54 and the resonator gaps 55-58 all have the same size and shape. The values of the equivalent circuit elements are then as follows:

$$L_0 = \mu_0 \pi r_0^2 / l \quad L_n = \mu_0 r_n^2 / l \quad C_n = \epsilon w l / t$$

where
$n = 1, 2, 3, 4 \ldots$
$\mu_0$ = permeability of free space.
$\epsilon$ = dielectric constant of the material in the gaps.
$l$ = length of the resonator block.
$r, t$ and $w$ = dimensions shown in FIG. 3E.

The impedance of this equivalent circuit is given by the following:

$$Z = \frac{j\omega L_0 [jn\omega L/(1 - \omega^2 LC)]}{j\omega L_0 + jn\omega L/(1 - \omega^2 LC)}$$

At resonance this expression is reduced to the following:

$$L_0 + nL - \omega^2 L L_0 C = 0$$

The resonant frequency can then be expressed as follows:

$$F = (\tfrac{1}{2}\pi r_0)\sqrt{nt(1 + r_0^2/nr^2)/\pi r_0 w \mu_0 \epsilon}$$

With the dimensions indicated in Table A the calculated resonant frequency of the structure of FIG. 3A using the above equation is 6.84 GHz.

TABLE A

| | |
|---|---|
| $r_0$ | = 2.25 mm |
| $r_1 = r_2 = r_3 = r_4$ | = 3.17 mm |
| $t_1 = t_2 = t_3 = t_4$ | = 0.25 mm ± 0.02 |
| $w_1 = w_2 = w_3 = w_4$ | = 3.45 mm |
| $\epsilon$ | = 1.0 = relative dielectric constant |

Figure 3B:
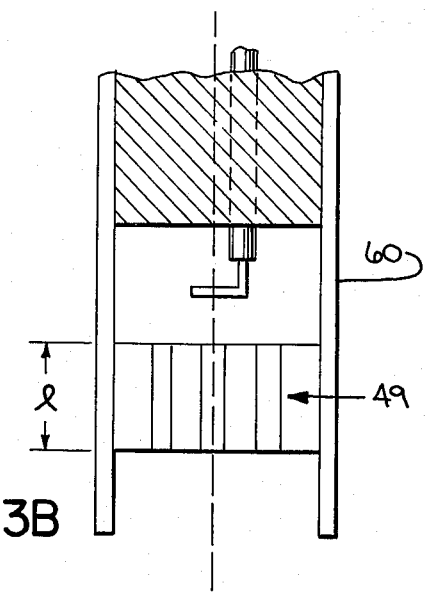
Figure 3C:
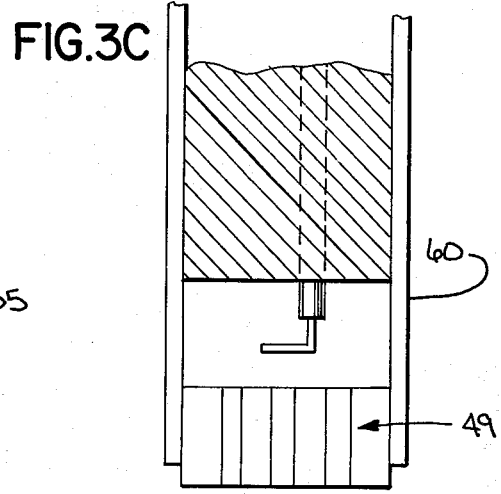
Figure 3D:
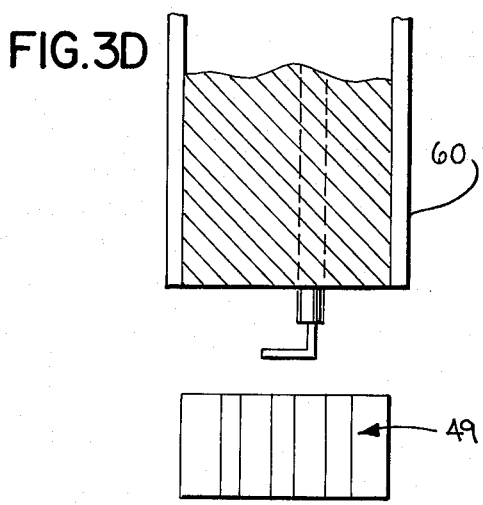

The actual resonant frequency of this resonator network was measured using the three resonator assemblies indicated in FIGS. 3B, 3C and 3D. In FIG. 3B the resonator 49 includes a shield 60 that extends from each end; in FIG. 3C the shield 60 extends only in one direction; and in FIG. 3D the resonator 49 is unshielded. The results are indicated in Table B along with the measured quality factor, Q.

TABLE B

| | Resonant frequency | Quality factor |
|---|---|---|
| FIG. 3B | 6.75 GHz | Q = 1100 |
| FIG. 3C | 6.77 GHz | Q = 620 |
| FIG. 3D | 6.84 GHz | Q = 590 |

The calculated resonant frequency agrees with the measured resonant frequency of the resonator without a surrounding shield. The addition of a shield 60 lowers the resonant frequency slightly, but its main impact is on the quality factor (Q) of the resonator.

It should be apparent that a wide variety of geometries are available to the researcher employing the resonator network of the present invention. These geometries may be selected to provide the desired resonant frequency, quality factor and magnetic field intensity for the particular gyromagnetic resonance measurement being made. In addition, the geometry may be selected for ease of manufacture and thermal and mechanical stability.

We claim:

1. A lumped circuit loop-gap resonator network which comprises:
a block of material having a plurality of resonator loops formed therein by corresponding openings which extend lengthwise completely through the block and which have electrically conductive walls, and having a resonator gap formed by a slot which extends completely through the block and which intersects a pair of resonator loops along their entire length, and in which the walls of the slot are formed from an electrically conductive material.

2. The lumped circuit loop-gap resonator network as recited in claim 1 in which there are n resonator loops, and there are n-1 resonator gaps which intersect the resonator loops to form a string network.

3. The lumped circuit loop-gap resonator network as recited in claim 1 in which there are n resonator loops, and there are n resonator gaps which intersect the resonator loops to form a ring network.

4. The lumped circuit loop-gap resonator network as recited in claim 1 in which there are n resonator loops, and there are n-1 resonator gaps which intersect the resonator loops to form a star network.

5. The lumped circuit loop-gap resonator network as recited in claim 1 in which a conductive shield encircles the block of material and extends lengthwise beyond each end of the block of material to form spaces which connect to the respective ends of the resonator loops.

6. The lumped circuit loop-gap resonator network as recited in claim 5 in which means for injecting electromagnetic energy into the resonator network is mounted in one of the spaces.

7. The lumped circuit loop-gap resonator network as recited in claim 1 in which the resonator gap defines a circular path which divides the block of material into two parts.

8. The lumped circuit loop-gap resonator network as recited in claim 1 in which the resonator loops are circular in shape and the resonator gap defines a circular path which intersects each resonator loop tangentially.

9. The lumped circuit loop-gap resonator network as recited in claim 1 in which the block of material is comprised of a base material which is electrically nonconductive and said electrically conductive walls are formed by an electrically conductive layer disposed on the base material.

10. In a gyromagnetic resonance spectrometer, the combination comprising:
   a lumped circuit loop-gap resonator network which includes a block of material having a plurality of openings formed therein and extending lengthwise completely through the block, and in which the wall of each opening is electrically conductive to form a resonator loop, and in which each such resonator loop is intersected along its entire length by a slot which intersects with another such resonator loop in the block, and in which the walls of each slot are electrically conductive to form a resoator gap; and
   means for coupling electromagnetic energy to the lumped circuit loop-gap resonator network.

* * * * *